(12) United States Patent
Short et al.

(10) Patent No.: US 11,305,404 B2
(45) Date of Patent: Apr. 19, 2022

(54) SPRUNG CARRIER

(71) Applicant: ASM Assembly Systems Singapore Pte. Ltd., Singapore (SG)

(72) Inventors: Neil Short, Weymouth (GB); Sam Staniland, Weymouth (GB)

(73) Assignee: ASM ASSEMBLY SYSTEMS SINGAPORE PTE. LTD., Singapore (SG)

(*) Notice: Subject to any disclaimer, the term of this patent is extended or adjusted under 35 U.S.C. 154(b) by 66 days.

(21) Appl. No.: 16/861,259

(22) Filed: Apr. 29, 2020

(65) Prior Publication Data

US 2020/0391355 A1 Dec. 17, 2020

(30) Foreign Application Priority Data

Jun. 11, 2019 (GB) ...................................... 1908304

(51) Int. Cl.
*B25B 5/08* (2006.01)
(52) U.S. Cl.
CPC ...................................... *B25B 5/08* (2013.01)
(58) Field of Classification Search
CPC ... B25B 5/08; B25B 11/00; B23Q 3/00; B23P 19/00; B23P 19/04; H01L 21/68; H01L 21/683; H01L 21/6835; H01L 21/673–6734
USPC ... 269/289 R, 229, 291, 296, 298, 303, 317, 269/318
See application file for complete search history.

(56) References Cited

U.S. PATENT DOCUMENTS

| | | | | |
|---|---|---|---|---|
| 4,549,651 A | * | 10/1985 | Alemanni | ............ H05K 7/1084 206/560 |
| 4,591,053 A | * | 5/1986 | Alemanni | ............ H05K 9/0067 206/724 |
| 4,620,632 A | * | 11/1986 | Alemanni | ............ H05K 7/1084 206/560 |
| 6,012,713 A | | 1/2000 | Gleason | |
| 8,281,483 B2 | * | 10/2012 | Hofmann | ............. G01R 1/0466 29/739 |
| 2007/0119044 A1 | | 5/2007 | Wu | |
| 2009/0104014 A1 | | 4/2009 | Satou | |
| 2010/0230885 A1 | | 9/2010 | Di Stefano | |
| 2011/0042264 A1 | | 2/2011 | Hofmann | |
| 2012/0200993 A1 | * | 8/2012 | Aoki | ......................... G06F 1/16 361/679.02 |
| 2017/0301575 A1 | * | 10/2017 | Wammetsberger | ......................... G01R 31/2893 |

FOREIGN PATENT DOCUMENTS

| | | |
|---|---|---|
| CN | 108698209 A | 10/2018 |
| GB | 2443659 A | 5/2008 |
| JP | H06-180345 A | 6/1994 |
| JP | H 11-233997 A | 8/1999 |
| JP | 2016-060508 A | 4/2016 |
| JP | 2018-022728 A | 2/2018 |
| TW | 200721407 A | 6/2007 |
| TW | M499643 U | 4/2015 |

* cited by examiner

*Primary Examiner* — Joseph J Hail
*Assistant Examiner* — Robert C Moore
(74) *Attorney, Agent, or Firm* — Ostrolenk Faber LLP

(57) ABSTRACT

Tooling for engaging with a workpiece has a body and a spring section formed as a monolithic structure from a resilient material. At least three deformable arms connect a movable shuttle to the body, the arms being configured to enable constrained movement of the shuttle relative to the body.

13 Claims, 6 Drawing Sheets

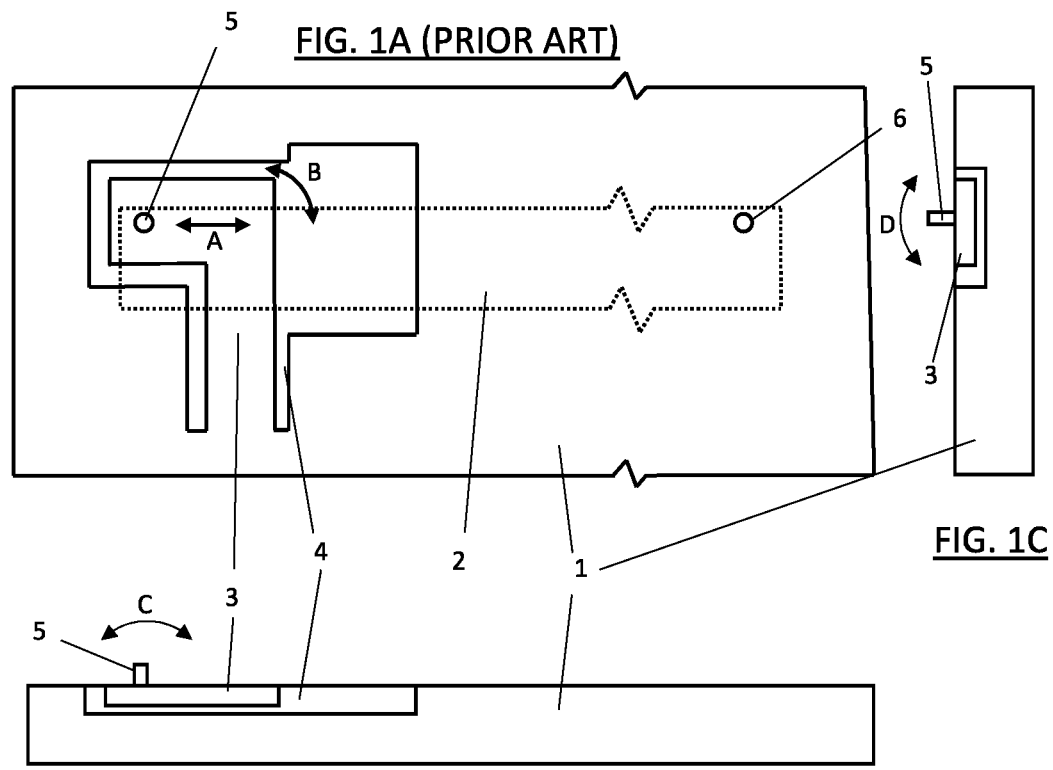
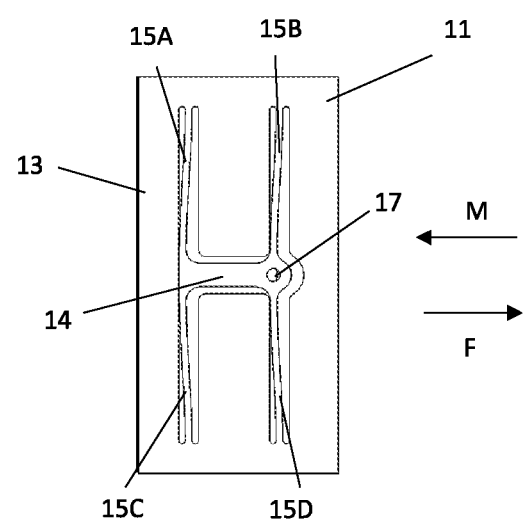

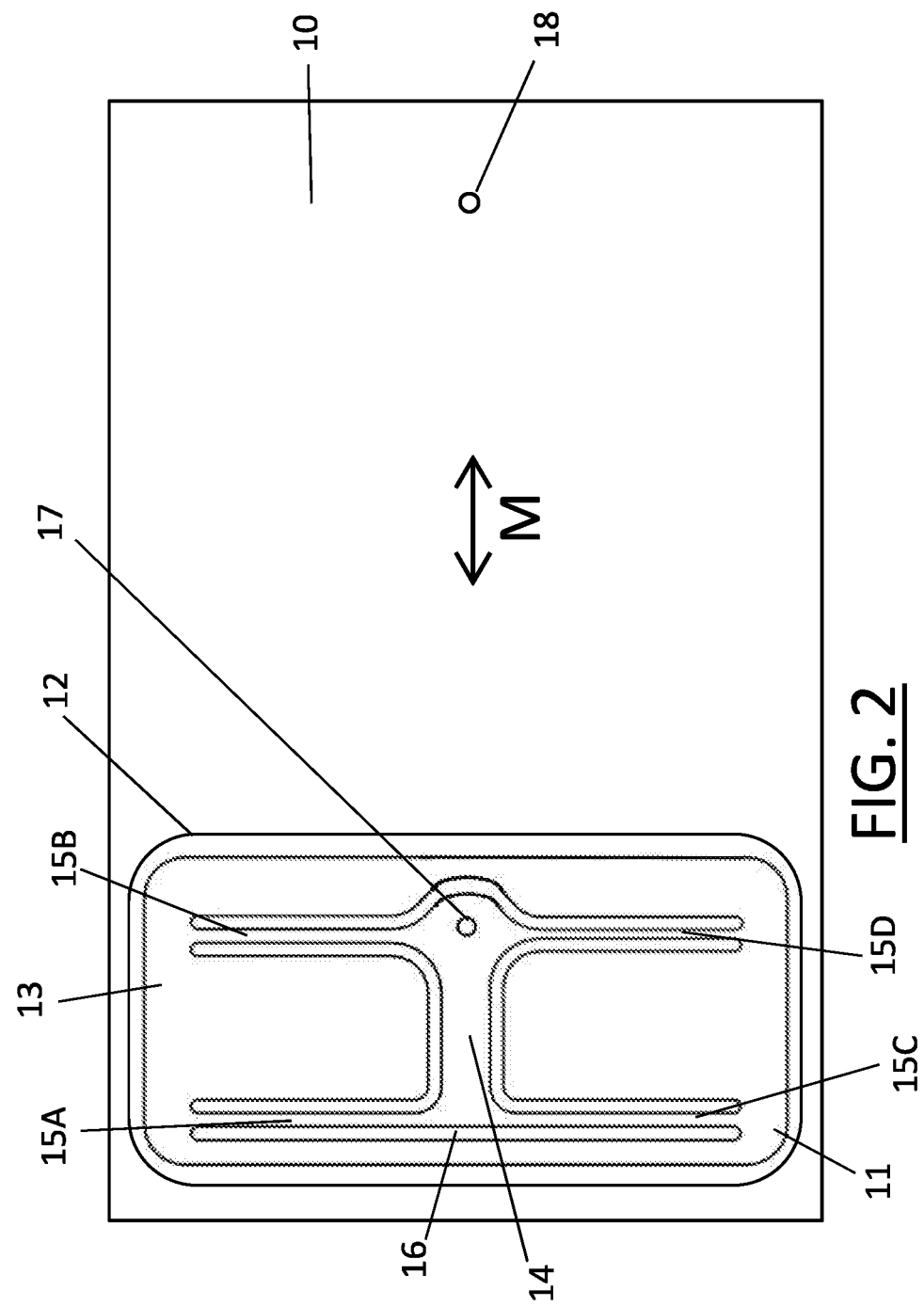

SPRUNG CARRIER

BACKGROUND AND PRIOR ART

There are various techniques used for securing workpieces, for example semiconductor boards, wafers, circuit boards etc for processing, such as a printing or machining process. For example, vacuum clamping is widely used, since it is reliable and controllable. However, there are various situations where vacuum clamping is either technically unsuitable, or unsuitable in terms of cost. A robust securing system makes use of sprung carriers which carry a workpiece and include tooling to effect a resilient, mechanical clamping. A preferred option for such carriers is to provide the tooling by machining (i.e. using a machine tool) a spring arm into the body of a plastics or other rigid but resiliently deformable material, and support a workpiece on the body, with at least one part of the workpiece attached to the body, with another part of the workpiece attached to the spring arm. Such attachment may, for example, involve providing a protruding pin on both the carrier body and the arm, which pins engage corresponding holes formed in the workpiece. It is important that a sprung system is used to cater for manufacturing variation in a batch of workpieces, and to allow for thermal expansion and compression of workpieces.

An example of a known sprung carrier 1 is schematically shown from above in FIG. 1A, from the side in FIG. 1B and from the end in FIG. 1C, in this example for mounting an elongate circuit board 2. In practice, the carrier 1 and board 2 may be many times longer than illustrated. The carrier 1 has tooling including a spring leg 3, in this example an "L-shaped" leg, formed in a first end thereof, by machining the plastics material of the carrier 1. The machining process creates a gap 4 around the leg 3, which allows the leg to move relative to the rest of the carrier 1. A protruding pin 5 is located at the distal end of the leg 3, for engagement with a corresponding hole at an end of board 2. The other end of board 2 similarly engages with a pin 6 at the other, second end of the carrier 1. The plastics material of the carrier 1 is resilient, and so the leg 3 acts as a spring, allowing movement, which is intended, in the direction A parallel to the length of the board 2, while supplying a biasing force towards the neutral position shown.

However, such a carrier has associated problems. In particular, the leg 3 will rotate, in a direction B lying within the plane of the carrier, under torsion. This may cause pin 5, and hence board 2, to move away from the main axis, with an unwanted movement component perpendicular to direction A. This may require additional measures to ensure correct subsequent processing, which may add to processing time and equipment cost.

In addition, force applied to the leg 3 through pin 5 may cause the leg to bend away from the plane of the carrier 1, so that the upper surface of the carrier 1 is no longer completely level. For example, if a board 2 cools and therefore contracts, the shrinkage may cause the free end of leg 3 to lift up, i.e. rotating in a direction C about a rotational axis parallel with the major length of the leg 3 and orthogonal to direction A. This may cause the board 2 to be lifted away from the carrier 1, which can cause significant problems during subsequent processing. Likewise, a thermal expansion of the board 2 could cause the free end of leg 3 to rotate downwardly, placing strain on the board 2. In addition, it is also possible that in some circumstances, the leg 3 may be caused to rotate in a direction D about an axis parallel to direction A.

Such problems may be exacerbated with carriers of greater complexity than the relatively simple carrier 1 of FIGS. 1A-C. For example, where the carrier is intended to mount and align a plurality of boards in an array, different amounts of rotation between different boards can cause alignment errors.

The present invention seeks to avoid these problems, and provide engagement tooling for a carrier which completely or at least substantially eliminates unwanted rotation or lifting components in board mounting.

In accordance with the present invention this aim is achieved by an improved spring section which may be machined into a body block, which prevents unwanted movement including rotation by employing a multiple spring mechanism.

SUMMARY OF THE INVENTION

In accordance with a first aspect of the present invention there is provided tooling for engaging with a workpiece, the tooling comprising a body and a spring section formed as a monolithic structure from a resilient material, the spring section comprising:
a shuttle; and
at least three deformable arms each connecting the shuttle to the body;
the tooling further comprising an engagement member carried by the shuttle, for engaging with a workpiece in use,
wherein the arms are configured to enable constrained movement of the shuttle relative to the body.

In accordance with a second aspect of the present invention there is provided a carrier for carrying at least one workpiece, comprising tooling according to the first aspect.

Other specific aspects and features of the present invention are set out in the accompanying claims.

For purposes of clarity and consistency, the following terms as used throughout this text and the appended claims should be interpreted as follows:

"Monolithic" is used to mean integrally-formed from a single original mass of material;

"Tooling" is used to mean equipment or apparatus adapted to support, carry and/or constrain workpieces in a working position; and "Workpiece" is used to mean substantially planar boards, including in particular, but not limited to, semiconductor boards, wafers and circuit boards.

BRIEF DESCRIPTION OF THE DRAWINGS

The invention will now be described with reference to the accompanying drawings (not to scale), in which:

FIGS. 1A-C schematically shows a known sprung carrier from above, the side and the end respectively;

FIG. 2 schematically shows, from above, a carrier including tooling in accordance with an embodiment of the present invention;

FIG. 3 schematically shows, from above, tooling in accordance with an embodiment of the present invention in a displaced configuration;

DETAILED DESCRIPTION OF THE PREFERRED EMBODIMENTS OF THE INVENTION

Figure 4:
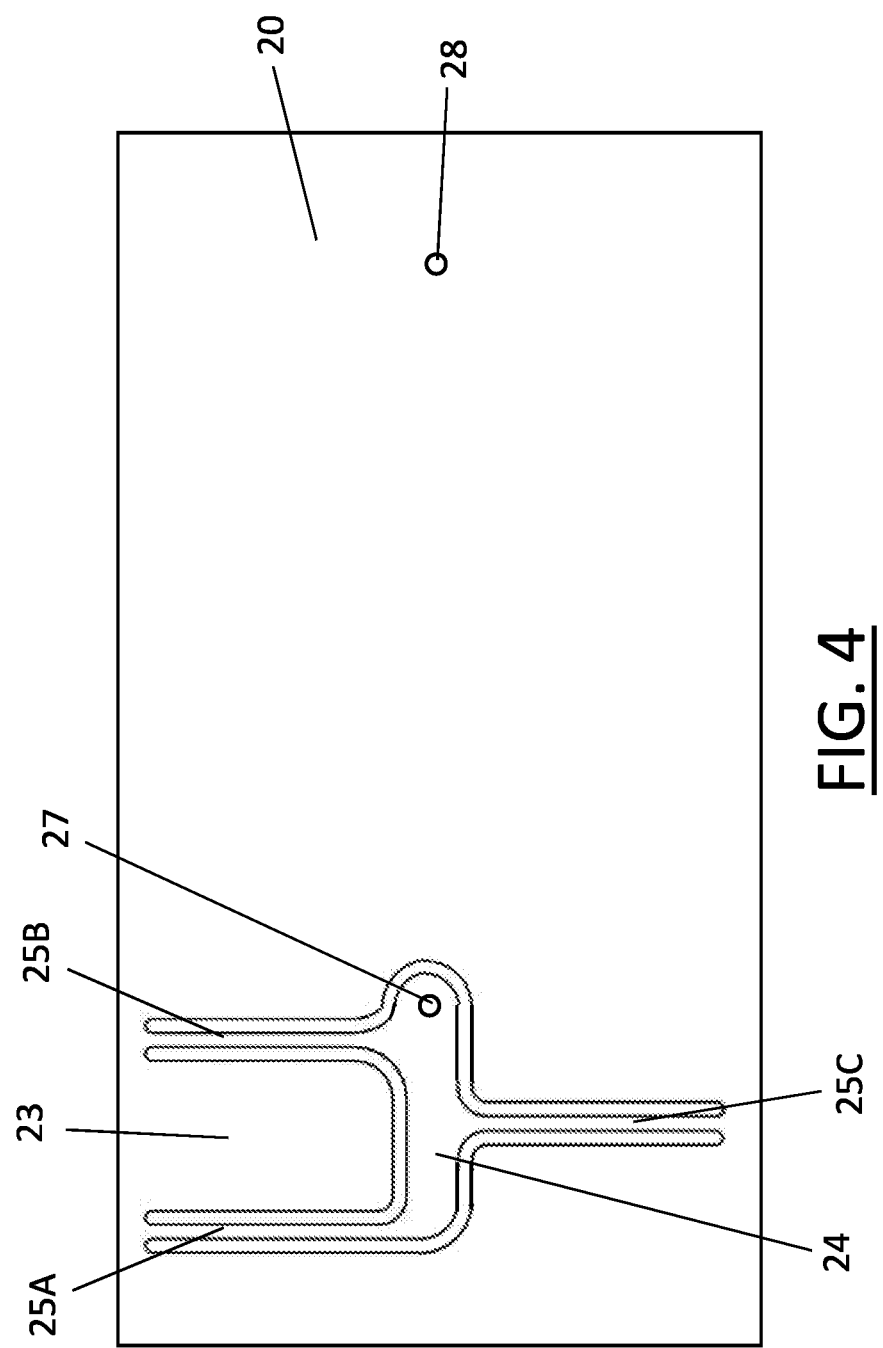
FIG. 4 schematically shows, from above, a carrier including tooling in accordance with a further embodiment of the present invention.

FIG. 2 schematically shows, from above, an elongate carrier 10 including tooling 11 in accordance with an embodiment of the present invention. This type of carrier 10 has a similar use as the carrier 1 shown in FIG. 1, i.e. to securely carry an elongate board (not shown). The carrier 10 is not shown to scale, and could, for example, be much longer than shown. The carrier 10 is formed from a rigid material, such as, for example a rigid plastics material, and has the basic form of a rectangular slab of substantially constant thickness (i.e. the direction into the page). In this embodiment, the tooling 11 is provided as a discrete item, which is located within an opening 12 of carrier 10 at one end thereof. Various fixing means (not shown) may be used to secure the tooling 11 to the carrier 10, for example screws, adhesive, clips, clamps or the like, as will be well understood by those skilled in the art, and opening 12 may extend throughout all or part of the thickness of the carrier 10 depending on the fixing means used. It is possible that the tooling 11 may optionally be fitted within carrier 10 the other way round if required. This type of design has flexibility, in that different tooling may be fitted to the carrier 10 as required, in a modular fashion. The tooling 11 has the basic form of a substantially rectangular slab (though in FIG. 2 the corners of the rectangle are shown as being slightly rounded for ease of handling) of substantially constant thickness, which is similar or thinner than that of the carrier 10, depending on the depth of the opening 12 and the fixing means used to secure it within the opening, but is arranged so that the upper surface of the tooling 11 is co-planar with the upper surface of the carrier 10, providing an evenly flat surface on which the board is carried.

The tooling 11 has a body 13 and a spring section, which spring section includes a shuttle 14 and at least three elongate and relatively thin deformable arms connecting the shuttle 14 to the body 13. As shown, there are four such deformable arms 15A-D, described in more detail below. The body 13 and spring section are formed as a monolithic structure from a rigid but resilient material, such as a plastics material. Advantageously, the same material may be used both for the carrier 10 and the body and spring section of the tooling, noting that such a material may be rigid and resistant to deformation when above a certain thickness, but more readily deformed when below that thickness, for example at the thickness of each arm 15A-D. The spring section is preferably formed by machining into a solid block of the resilient material, creating a movement gap 16 around the arms 15A-D and shuttle 14. In FIG. 2, the shuttle 14 is shown in a neutral state so that it produces no biasing force, and the width of the movement gap 16 is substantially constant is all places.

An engagement member, here in the form of a projecting pin 17 is mounted to the upper surface of the shuttle, so that it projects upwardly therefrom. A similar pin 18 is provided projecting from the upper surface of the carrier 10 at the distal end thereof, in line with pin 17 along the major axis of the carrier 10. In use, a board provided with a complementary-sized hole at each end thereof may therefore be located on the carrier and secured via these pins 17, 18.

Each of the deformable arms 15A-D are elongate, with their major arm axes (i.e. the axes running along respective arms) arranged in parallel, to constrain movement of the shuttle 14 to a translation along a movement axis orthogonal to the arm axes and parallel to a plane containing the arm axes, with this movement shown as "M" in FIG. 2. At least two of the deformable arms are spaced apart along the movement axis, e.g. each of arms 15A and 15C are spaced from each of arms 15B and 15D as shown. This arrangement prevents rotation of the shuttle 14 about an axis parallel to the arm axes. Furthermore, at least two of the deformable arms are spaced apart in a direction parallel to the arm axes, e.g. each of arms 15A and 15B is spaced from each of arms 15C and 15D as shown. This arrangement prevents unwanted movement of the shuttle 14 within the plane of the tooling 11, constraining its movement parallel to direction M.

FIG. 3 schematically shows, from above, tooling 11 in accordance with an embodiment of the present invention in a displaced configuration. The tooling 11 shown in FIG. 3 is identical to that of FIG. 2, except that the body 13 is of rectangular form, and so like reference numerals are retained. As shown in FIG. 3, here shuttle 14 is displaced relative to body 13 in a movement/displacement direction M, in this example from right to left as shown. It can be seen that the maximum displacement possible is constrained by the width of gap 16, so that when shuttle 14 abuts against the body 13, no further displacement in direction M is possible. The material of tooling 11 is resiliently deformable, and so displacement of the shuttle 14 in direction M gives rise to an opposing biasing force F, which impels the shuttle 14 back to the neutral position shown in FIG. 2. Of course, if the shuttle were displaced in the opposite direction, the resulting biasing force would also be reversed.

FIG. 4 schematically shows, from above, a carrier 20 including tooling in accordance with a further embodiment of the present invention. This embodiment has many similarities with that of FIG. 2, and so need not be described in great detail. In this embodiment, the carrier 20 with the body 23 and spring section of the tooling are formed as a monolithic structure. While this arrangement is not as flexible as that shown in FIG. 2, it is simpler to manufacture and provides potentially more accurate relative placings of pins 27 and 28. In this embodiment, the spring section only includes three deformable arms 25A-C connecting the body 23 to the shuttle 24. Arms 25A and 25B are spaced apart along the movement axis to prevent rotation of the shuttle 24 about an axis parallel to the arm axes. Furthermore, each of arms 25A and 25B is spaced from arm 25C in a direction parallel to the arm axes, to prevent unwanted movement of the shuttle 24 within the plane of the tooling.

Figure 5:
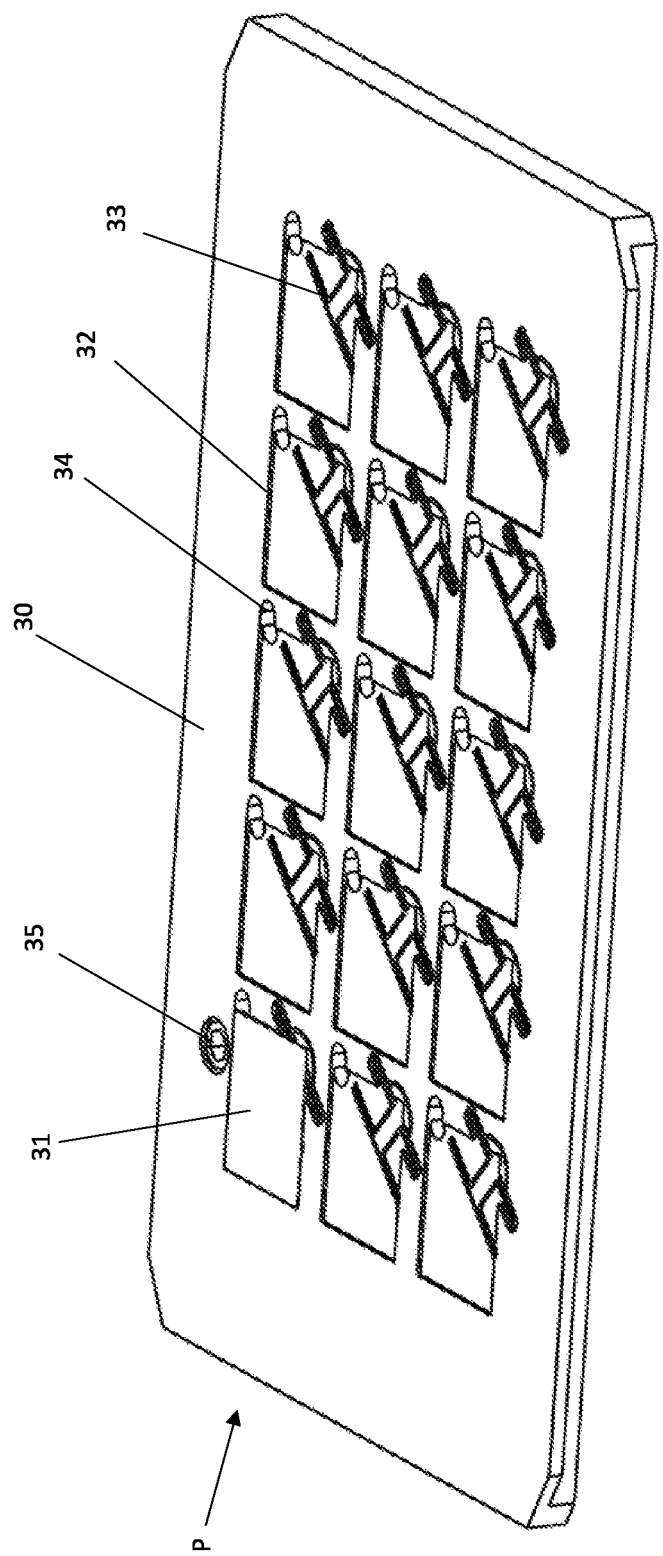
FIG. 5 schematically shows, in perspective view, a singulated pallet carrier in accordance with a further embodiment of the present invention.
Figure 6:
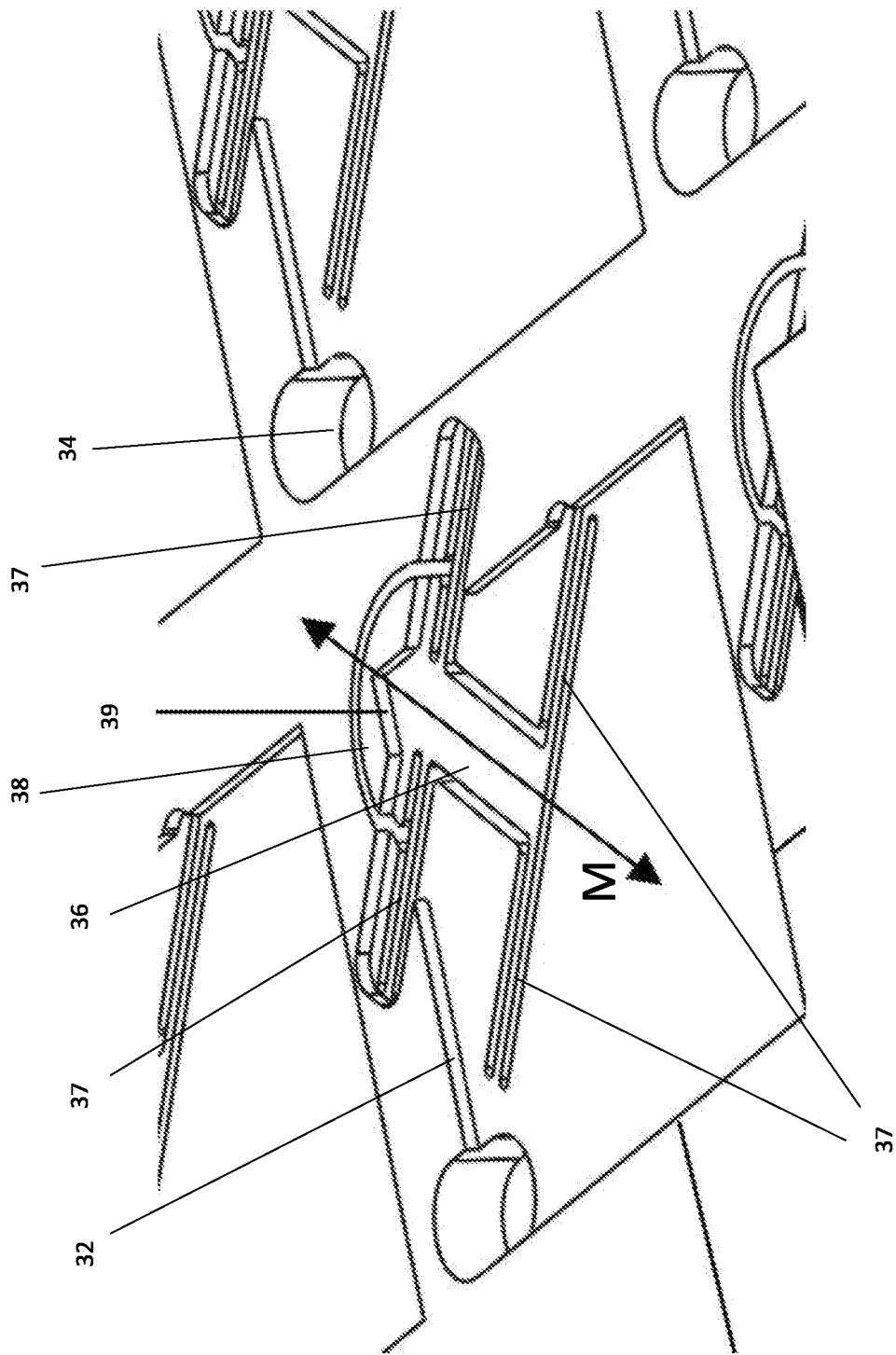
FIG. 6 schematically shows, in enlarged perspective view, the upper surface of the carrier of FIG. 5.
Figure 7:
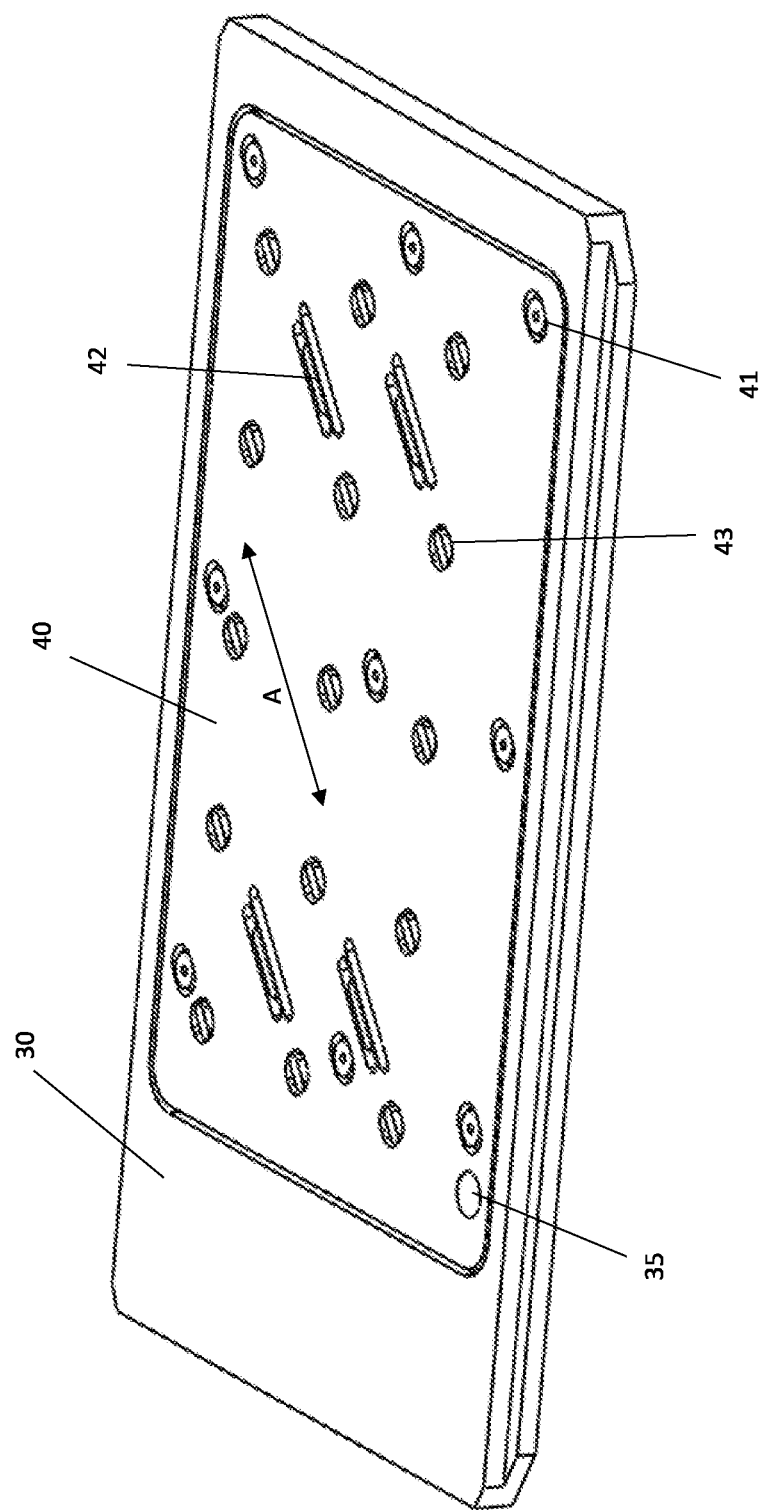
FIG. 7 schematically shows, in perspective view, the underside of the carrier of FIG. 5.

A further embodiment of the present invention, relating to a singulated pallet carrier will now be described with reference to FIGS. 5 to 7, in which FIG. 5 schematically shows, in perspective view, a singulated pallet carrier 30, FIG. 6 schematically shows an enlarged perspective view of the upper surface of the carrier 30 in the direction P, and FIG. 7 schematically shows, in perspective view, the underside of the carrier 30.

A singulated pallet carrier 30, such as that shown in FIGS. 5 to 7, is typically used to support and secure a plurality of workpieces for a simultaneous processing operation such as, for example, printing or metallisation with conductive paste or ink to produce printed circuit boards (PCBs). With such processes it is generally essential that the singulated workpieces are secured at the same relative orientation. The carrier 30 shown is capable of securing workpieces 31, and referencing them to the carrier 30 to ensure alignment. The bulk of the carrier 30 is formed from a rigid but resiliently deformable material, such as, for example, a plastics material.

Carrier 30 includes at its upper surface an array, here a 5 by 3 array, of frames 32 for accommodating individual respective workpieces 31, with one workpiece 31 being shown in place in FIG. 5. It should be noted that the carrier 30 will be designed for a particular size of workpiece 31, or workpieces within a narrow range of sizes, which conform closely to the dimensions of the frames 32. As shown, the frames 32 comprise rectangular recesses in the body of the carrier, sized so that a particular rectangular workpiece may rest within the recess with two adjacent sides in abutment with at least two adjacent sides of the recess. This is a particularly simple configuration, and enables the frames to be monolithically formed with the carrier. However, alternative configurations, for example in which the frames comprise upwardly projecting walls or barriers, are equally possible. Each frame 32 is at least partially defined by respective tooling 33, for engaging with the respective workpieces. As shown, each tooling 33 is monolithically formed with the carrier 30 by machining, so that the carrier 30 effectively constitutes the body of each tooling 33, but in alternative embodiments may be formed separately and subsequently fixed to the carrier 30. Each tooling 33 is aligned in the same orientation. The tooling 33 will be described in more detail below, with particular reference to FIG. 6. An access aperture 34 is formed within the carrier 30 at a corner of each frame 32, which apertures extend sufficiently deeply into the carrier 30 to enable a tool to be inserted inside and underneath a workpiece 31, to prize up and hence easily remove the workpiece from the carrier 30 as required. Also visible in FIG. 5 is a cam screw 35 housed in the carrier 30, the functioning of which will be described in more detail below with particular reference to FIG. 7.

FIG. 6 shows tooling 33 in more detail. The tooling 33 has many similarities with that shown in FIG. 2 for example, having a movable shuttle 36 mounted via four deformable arms 37 to the carrier 30. The shuttle 36 comprises, at one end thereof, an engagement head 38 which has a raised profile forming an interior right angle corner 39. In the neutral position shown, the right angle corner 39 is located slightly inwardly of the boundary of frame 32, and in this way partially defines the frame 32. The engagement head 38 thus comprises a surface of the shuttle 36 for engaging with a side of a workpiece 31 in use. As with the tooling of FIG. 2, the four deformable arms 37 act to constrain movement of the shuttle 36 along the direction M. When a correctly-sized workpiece 31 is inserted into a frame 32, a corner of the workpiece engages with the right angle corner 39 of the tooling 33, and pushes the shuttle outwardly with respect to its frame 32. The shuttle will be biased back towards the neutral position, and so the workpiece 31 will effectively be clamped between the engagement head 38 and the opposing surfaces of frame 32. Since all the toolings 33 of the carrier 30 have the same orientation, and the frames 32 within carrier 30 are aligned, the workpieces will be accurately referenced to the carrier 30.

FIG. 7 shows the underside of the carrier 30, and is taken from the same viewpoint as FIG. 5, though with carrier 30 flipped over about an axis extending left-right. An actuation plate 40 is mounted to the underside of carrier 30 by fixings 41. Conveniently, the plate 40 may be located within a recess formed in the base of carrier 30 as shown, or alternatively may underlie the base of carrier 30. The actuation plate 40 is movably mounted to carrier 30 by fixings 41 so that it can reciprocally move relative to the carrier 30 along an actuation direction axis A. Movement guides 42 act to constrain motion of the actuation plate 40 along this axis. An actuator, here cam screw 35, is operable to moving the actuation plate 40 along this axis. The actuation plate 40 is in cooperative engagement with the shuttle 36 of each tooling 33 via respective actuation members 43. In this way, when the actuation plate 40 is moved in a first, opening direction, by appropriate turning of the cam screw 35, each shuttle 36, and hence each engagement head 38, is caused to move relative to the carrier 30 and thereby enlarge the respective frame 32, so that a workpiece 31 can readily be placed within each frame 32. If the cam screw 35 is then either released or rotated in the opposite direction, the shuttles 36 will move under bias in an opposite, closing, direction, and thereby reference and clamp the workpieces.

The above-described embodiments are exemplary only, and other possibilities and alternatives within the scope of the invention will be apparent to those skilled in the art. For example, with the carrier of FIG. 2, the tooling could be located the other way up with respect to the carrier, i.e. so that it is rotated 180° to the orientation shown.

An actuation plate is not essential for singulated pallet carriers as shown in FIG. 7. Workpieces could for example be placed individually, or other techniques could be used to open the springs and enlarge the frames.

REFERENCE NUMERALS USED

1—Carrier
2—Board
3—Leg
4—Gap
5—Leg pin
6—Carrier pin
10, 20—Carrier
11—Tooling
12—Opening
13, 23—Body
14, 24—Shuttle
15A-D—Arms
16—Movement gap
17, 27—Shuttle pin
18, 28—Carrier pin
25A-C—Arms
30—Singulated pallet carrier
31—Workpiece
32—Frame
33—Tooling
34—Access aperture
35—Cam screw
36—Shuttle
37—Arms
38—Engagement head
39—Right angle corner
40—Actuation plate
41—Fixing
42—Movement guide
43—Actuation member
M—Movement/Displacement direction
F—Biasing force
P—View direction
A—Actuation direction axis
B-D—Rotation directions

The invention claimed is:

1. Tooling for engaging with a workpiece, the tooling comprising a body and a spring section formed as a monolithic structure from a resilient material, the spring section comprising:
a shuttle; and
at least three deformable arms each connected between the shuttle and the body;
the tooling further comprising an engagement member carried by the shuttle, for engaging with a workpiece in use,
wherein the arms are configured to enable constrained movement of the shuttle relative to the body, and
wherein the deformable arms are elongate, with their major arm axes arranged in parallel, to constrain movement of the shuttle to a translation along a movement axis orthogonal to the arm axes and parallel to a plane containing the arm axes.

2. The tooling of claim 1, wherein the spring section comprises four deformable arms.

3. The tooling of claim 1, wherein at least two of the deformable arms are spaced apart along the movement axis, and at least two of the deformable arms are spaced apart in a direction parallel to the arm axes.

4. The tooling of claim 1, wherein the engagement member comprises a pin mounted to the shuttle.

5. The tooling of claim 1, wherein the engagement member comprises a surface of the shuttle for engaging with a side of the workpiece.

6. A carrier arrangement for carrying at least one workpiece, comprising:
a carrier; and tooling for engaging with a workpiece, the tooling comprising a body and a spring section formed as a monolithic structure from a resilient material, the spring section comprising:
a shuttle; and
at least three deformable arms each connected between the shuttle and the body;
the tooling further comprising an engagement member carried by the shuttle, for engaging with a workpiece in use,
wherein the arms are configured to enable constrained movement of the shuttle relative to the body, and
wherein the deformable arms are elongate, with their major arm axes arranged in parallel, to constrain movement of the shuttle to a translation along a movement axis orthogonal to the arm axes and parallel to a plane containing the arm axes.

7. The carrier arrangement of claim 6, wherein the tooling is attached to the carrier.

8. The carrier arrangement of claim 6, wherein the carrier, body and spring section are formed as a monolithic structure.

9. The carrier arrangement of claim 6, comprising a plurality of toolings, for engaging with respective workpieces.

10. The carrier arrangement of claim 9, comprising a plurality of frames for accommodating individual respective workpieces, each frame being at least partially defined by a respective tooling.

11. The carrier arrangement of claim 10, wherein each tooling is aligned in the same orientation, and wherein the carrier comprises an actuation plate in cooperative engagement with the shuttle of each tooling, such that movement of the actuation plate in an opening direction causes the shuttle, and hence engagement member, of each tooling to move relative to the respective body and enlarge the respective frame.

12. The carrier arrangement of claim 11, comprising an actuator for moving the actuation plate in the opening direction.

13. The carrier arrangement of claim 12, wherein the actuator comprises a cam screw.

* * * * *